(12) United States Patent
Aoki

(10) Patent No.: US 7,939,745 B2
(45) Date of Patent: May 10, 2011

(54) COMPOUND THIN-FILM SOLAR CELL AND PROCESS FOR PRODUCING THE SAME

(75) Inventor: Satoshi Aoki, Sayama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 1142 days.

(21) Appl. No.: 10/509,303

(22) PCT Filed: Mar. 24, 2003

(86) PCT No.: PCT/JP03/03500
§ 371 (c)(1),
(2), (4) Date: Jun. 22, 2005

(87) PCT Pub. No.: WO03/081684
PCT Pub. Date: Oct. 2, 2003

(65) Prior Publication Data
US 2005/0236032 A1    Oct. 27, 2005

(30) Foreign Application Priority Data
Mar. 26, 2002   (JP) ................................. 2002-129381

(51) Int. Cl.
*H01L 25/00* (2006.01)
(52) U.S. Cl. ..................................................... 136/243
(58) Field of Classification Search .................. None
See application file for complete search history.

(56) References Cited

U.S. PATENT DOCUMENTS

| | | | | |
|---|---|---|---|---|
| 4,335,266 A | * | 6/1982 | Mickelsen et al. | 136/260 |
| 4,611,091 A | | 9/1986 | Choudary et al. | 136/260 |
| 5,674,555 A | * | 10/1997 | Birkmire et al. | 427/76 |

FOREIGN PATENT DOCUMENTS

JP           8-330614         12/1996

OTHER PUBLICATIONS

Yamaguchi, Yoshida, Minoura, Structural and compositional analyses on indium sulfide thin films deposited in aqueous chemical bath containing indium chloride and thioacetamide, 2003, Thin Solid Films, 431-432, pp. 354-358.*

(Continued)

*Primary Examiner* — Alexa D Neckel
*Assistant Examiner* — Shannon Gardner
(74) *Attorney, Agent, or Firm* — Fulbright & Jaworski L.L.P.

(57) ABSTRACT

A method of fabricating a thin-film compound solar cell having an n-type buffer layer formed therein for providing a heterojunction with a p-type compound semiconductor light absorbing layer formed on a back electrode by applying a chemical bath deposition (CBD) process using an aqueous solution for dipping the light absorbing layer to deposit particles on the surface thereof. In this process, the temperature of the solution is controlled from low to high to increase sizes of the particles to be deposited on the light absorbing layer so as to form the buffer layer which possesses a high optical transmittance, tight adherence to the light absorbing layer and conformity with the transparent electrode formed thereon even if it would be made of InS material generally possessing a small bandgap and hard to pass light of short wavelengths.

1 Claim, 4 Drawing Sheets

OTHER PUBLICATIONS

Nakada, Furumi, Kunioka, High-Efficiency Cadmium-free Cu(In,Ge)Se2 Thin-Flim Solar Cells with Chemically Deposited ZnS Buffer Layers, Oct. 1999, IEEE Transaction on Electron Devices, vol. 46 No. 10, pp. 2093-2097.*

Hashimoto, Kohara, Negami, Nishitani, Wada, Chemical Bath Deposition of CdS buffer layer for CIGS solar cells, 1998, Solar Energy Materials and Solar Cells, 50, pp. 71-77.*

Dona, Herrero, Chemical Bath Deposition of CdS Thin Films: An Approach to the Chemical Mechanism Through Study of the Film Microstructure, 1997, J. Electrochem. Soc., vol. 144 No. 11, pp. 4081-40941.*

R. Bayon, Preparation of Indium Hydroxy Sulffide Thin Films by Chemical Bath Deposition, J. Electrochem. Soc. vol. 145, No. 8, Aug. 1998, 2775-2779.*

"Study of Cd-free buffer layers using $In_x(OH,S)_y$ on CIGS solar cells" by C.H. Huang et al., Solar Energy Materials & Solar Cells 69 (2001) 131-137.

* cited by examiner

COMPOUND THIN-FILM SOLAR CELL AND PROCESS FOR PRODUCING THE SAME

BACKGROUND OF THE INVENTION

The present invention relates to a compound semiconductor thin-film solar cell having an n-type buffer layer for heterojunction with a light absorbing layer and a method of fabricating the same compound semiconductor thin-film solar cell.

FIG. 1 shows a basic structure of a thin-film solar cell produced from a general compound semiconductor, which comprises a SLG (soda lime glass) substrate 1 on which a back molybdenum (Mo) electrode layer (positive electrode) 2, a p-type light absorbing layer 5, an n-type heterojunction buffer layer 6 and a transparent electrode layer (negative electrode) 7 are subsequently formed in the described order.

In the thin-film compound semiconductor solar cell, the light absorbing layer 4 is made in the form of a CIGS (Copper-Indium-Gallium-Selenium) thin film made of Cu (In+Ga) Se2 of I-III-VI2 group based on Cu, (In, Ga), Se, which possesses high power conversion efficiency exceeding 18%.

U.S. Pat. No. 4,611,091 discloses a method of forming a heterojunction buffer layer most suited to a light absorbing layer of CIS by chemically growing a thin film of CdS representing a compound semiconductor of II-VI group from a solution.

Japanese Laying-Open Patent Publication No. H-8-330614 describes a heterojunction buffer layer of Zn which does not contain harmful metal such as cadmium and possesses high power conversion efficiency.

The above-described conventional compound thin film solar cells involve such a common problem that a defect easily occur in the junction between a p-type semiconductor light absorbing layer and an n-type semiconductor buffer layer because two layers quite differ from each other by their chemical compositions.

While the light absorbing layer is dipped in the solution, two processes of diffusing Zn element into the light absorbing layer and forming a ZnS film concurrently take place, which may easily cause variations in power conversion efficiency of the product from the crystallinity and surface conditions of the light absorbing layer.

To obtain a heterojunction suitable to the light absorbing layer of CIGS thin film, a buffer layer of InS (InS, InO, InOH) is formed by a CBD method that has been developed to attain the uniformity of composition and reproducibility of the product (see reference "Solar Energy Materials & Solar Cells" 69, 2001, pp. 131-137).

However, the formation of a buffer layer of InS group by the Chemical Bath Deposition (CBD) method for forming a heterojunction suited to the light absorbing layer of CIGS thin film still involves a problem that the buffer layer of InS has a small band gap and generally is hard to pass light of short wavelengths. Namely, it cannot result in high Jsc.

SUMMARY OF THE INVENTION

Accordingly, an object of the present invention is to provide a method of fabricating a solar cell having an n-type buffer layer providing a heterojunction with a light absorbing layer formed on a back electrode, wherein the buffer layer is formed by CBD (Chemical Bath Deposition) process using a aqueous solution for dipping the light absorbing layer in such a way that particles can be deposited on the light absorbing layer to form a buffer layer of InS, which has a grain structure improved to pass even light of short wavelengths. The CBD process according to the present invention specifically increases sizes of particles to be deposited by conducting a first step of maintaining the solution at a first temperature for a first preset time, a second step of increasing the temperature of the solution from the first temperature to a second higher temperature for a second preset time and a third step of maintaining the solution at the second temperature for a third preset time.

Another object of the present invention is to provide a method of fabricating a solar cell having an n-type buffer layer formed for providing a heterojunction with a light absorbing layer formed on a back electrode, wherein the buffer layer is formed by CBD of particles of n-type semiconductor material. The CBD process according to the present invention provides a buffer layer of n-type semiconductor material, which is featured by gradually or step-by-step increased sizes of deposited particles in the outward direction from the light absorbing layer.

In this case, according to the present invention, a buffer layer is formed of stepwise deposits of particles of n-type semiconductor material in such manner as the layer has a profile which represents deposits having different pH-values: upper deposits have larger pH value.

PREFERRED EMBODIMENT OF THE INVENTION

Figure 1:
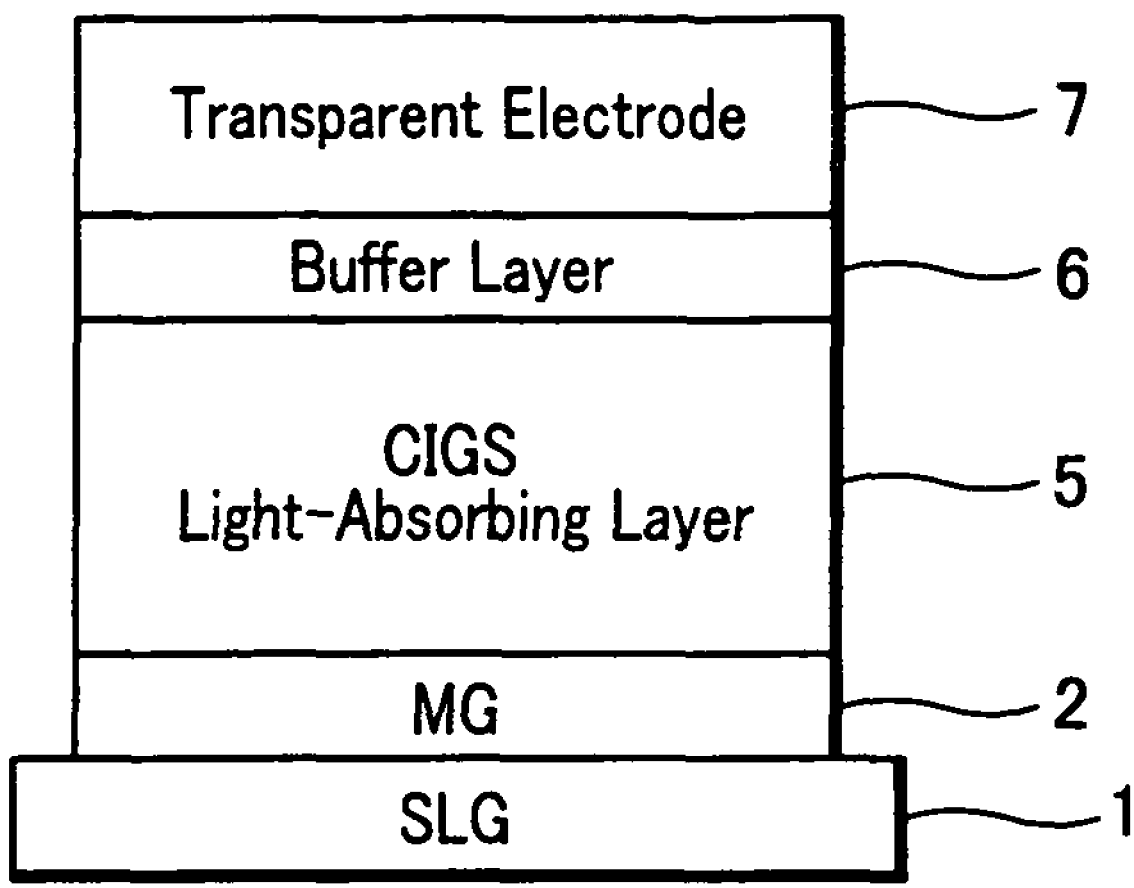
FIG. 1 is a sectional illustration of a basic structure of a solar cell of general compound semiconductors.
Figure 2:
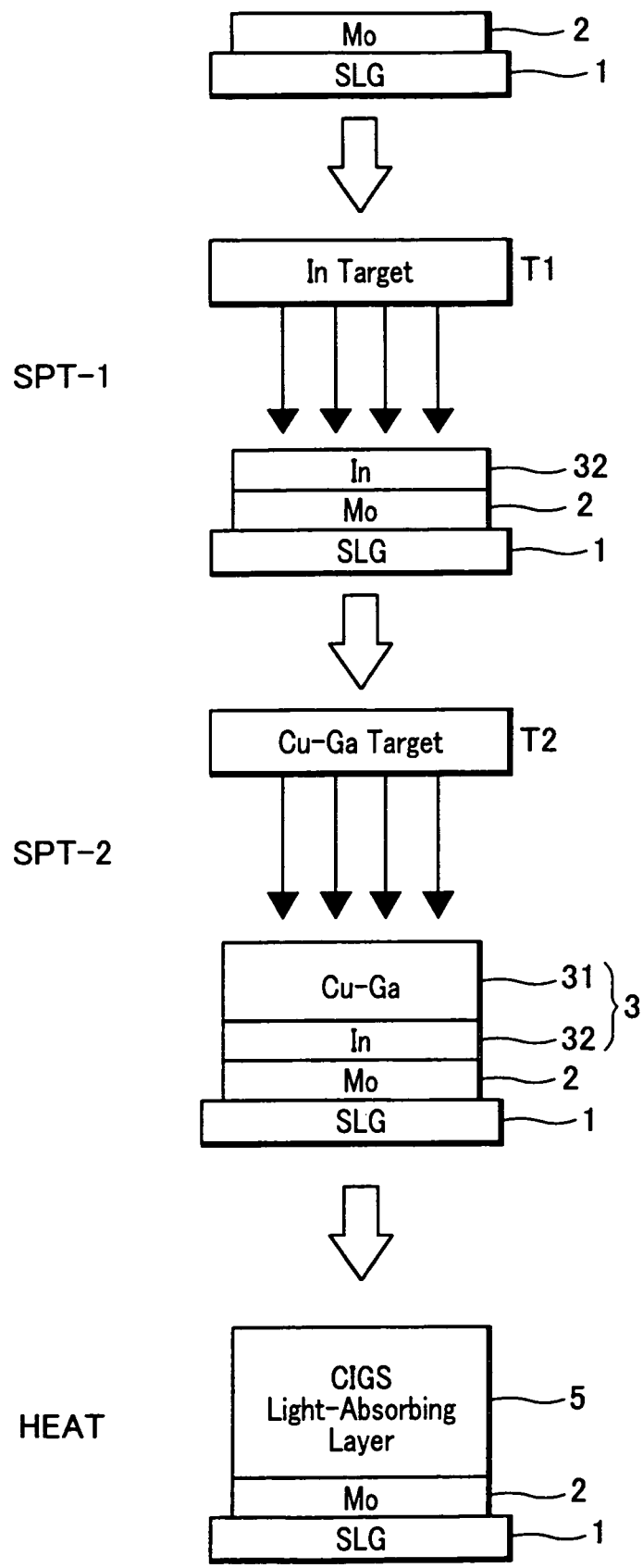
FIG. 2 illustrates a process of forming a back electrode and a light absorbing layer on a substrate of soda lime glass (SLG).
Figure 3:
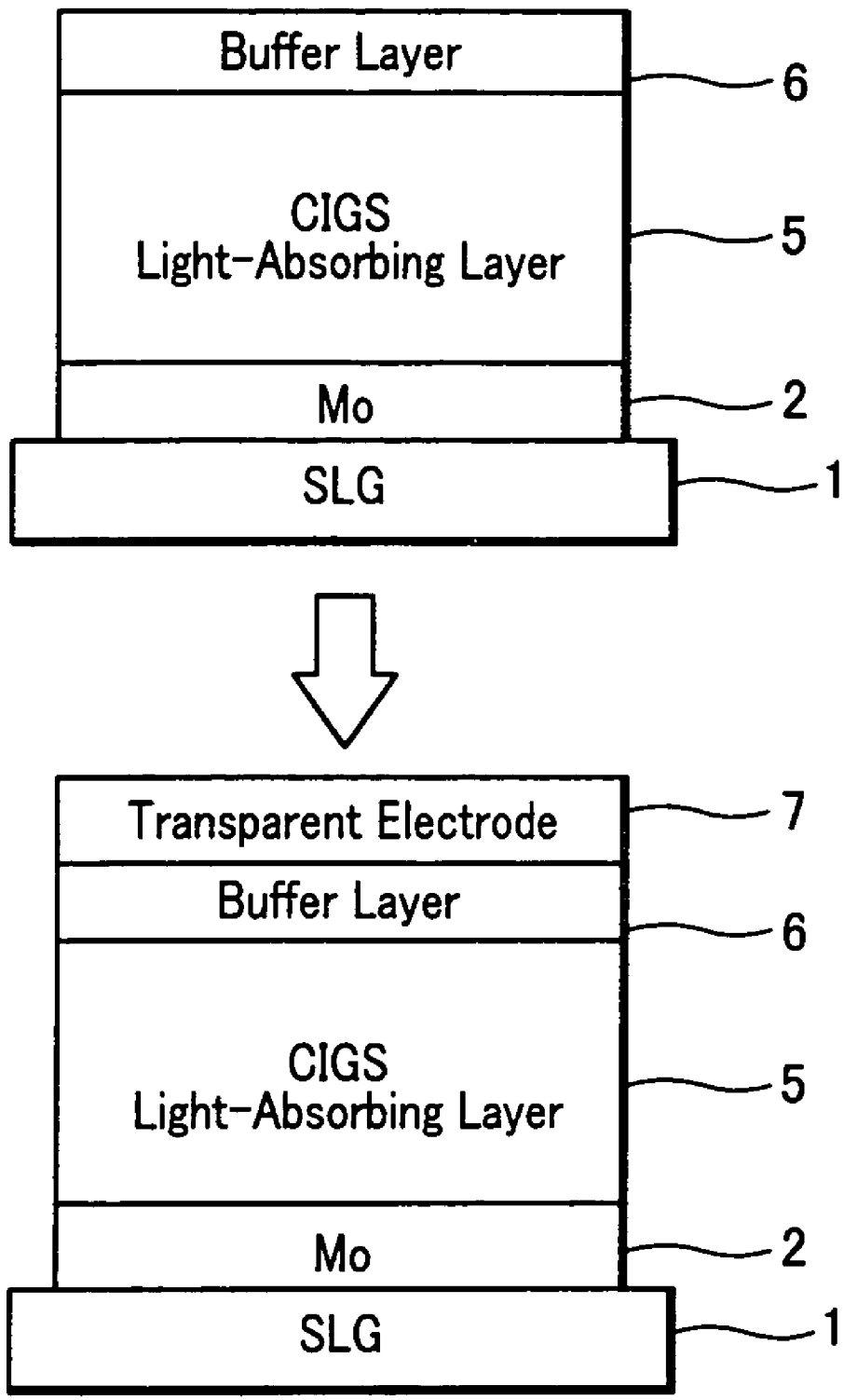
FIG. 3 illustrates a process of forming a buffer layer and a transparent electrode layer on a light absorbing layer.

In FIGS. 2 and 3, there is shown a process of fabricating a compound semiconductor thin-film solar cell.

As shown in FIG. 2, a molybdenum (Mo) electrode layer 2 serving as a back electrode is first formed by sputtering on a SLG (soda lime glass) substrate 1. Next, an indium (In) layer 32 is formed on the back electrode layer 2 by the first sputtering process SPT-1 using a single In target T1 and a copper-gallium (Cu—Ga) alloy layer 31 is formed thereon by the second sputtering process SPT-2 using a Cu—Ga alloy target T2 to form a laminated metal precursor 3 composed of the In layer 32 and the Cu—Ga alloy layer 31. The precursor 3 is then treated by heat (by the heat treatment process HEAT) in the atmosphere of selenium (Se) to form a thin film light absorbing layer 5 of CIGS.

As described above, a laminated precursor 3 is fabricated by forming first an In layer 32 and then a Cu—Ga alloy layer 31 on a Mo electrode layer 2, thereby preventing the formation of an alloy of elements diffused in solid phase at a boundary between the precursor 3 and the Mo electrode layer 2. This can also facilitate In component to sufficiently diffuse in the precursor on the side of the Mo electrode layer 2 in the process of selenizing the laminated precursor 3 by heating in the selenium atmosphere, simultaneously preventing slowly diffusing elements Ga from segregating at the boundary of the Mo electrode layer 2 and forming thereat a different alloy layer of Cu—Ga—Se which is inferior in its crystal structure. The CIGS light absorbing layer 5 thus fabricated can possess high quality P-type semiconductor structure featured by the homogeneous crystal structure of Cu (In+Ga) Se2. The light absorbing layer 5 can be featured by high performance and high strength of adhesion between the Mo electrode layer 2 and the light absorbing layer 5 and is free from the formation of a strange layer (Cu—Ga—Se layer) having an inferior crystal structure and possessing conductivity. Consequently, a solar cell fabricated based on the thus fabricated light absorbing layer can possess high strength and is free from leakage from/to other cells when it is used in practice.

On the p-type light absorbing layer 5, as shown in FIG. 3, there is then formed a n-type buffer layer 6 for providing a heterojunction with the p-type layer 5 and a transparent electrode layer 7 of ZnS is further formed by sputtering on the buffer layer 6, as shown in FIG. 3.

According to the present invention, the buffer layer 6 of InS is formed by wet chemical bath deposition (CBD) using an aqueous solution of indium chloride and thioacetamide. In practice, the aqueous solution is prepared as a 1:1 mixture of two solutions: 0.01M/l of indium-3-chloride-4-hydrate (InCl3.4H2O) and 0.30M/l of thioacetamide (CH3CSNH2).

Figure 4:
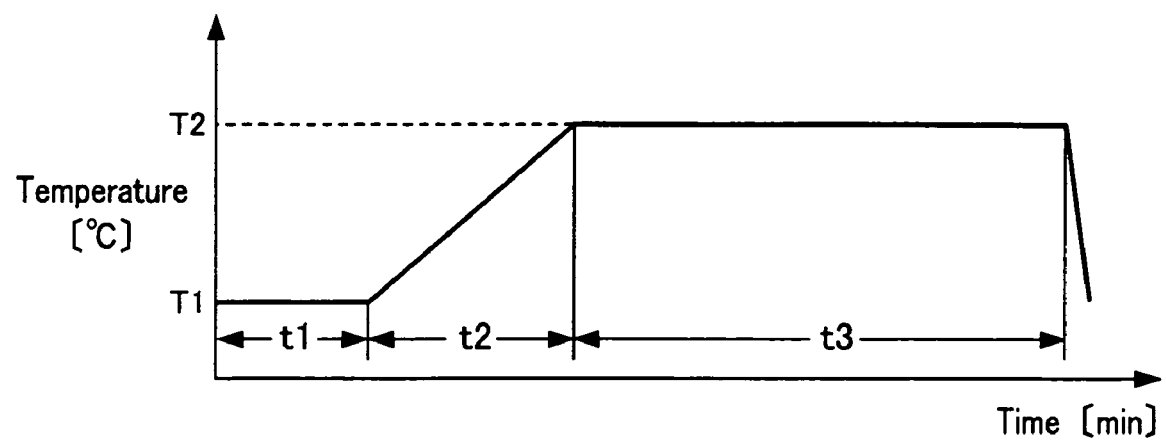
FIG. 4 is a graph showing temperature characteristics of aqueous solution when forming a buffer layer by the CBD method according to the present invention.

The buffer layer 6 is formed by CBD using the above-prepared aqueous solution according to the following process shown in FIG. 4.

In the first step, the surface of the light absorbing layer 5 is dipped in the aqueous solution at a room temperature T1 (° C.) for a preset time t1 (5-10 minutes) while stirring the solution. Stirring of the solution is continued until the buffer layer 6 is completely formed.

In the second step, the temperature of the solution is increased to a preset value T2 (about 60° C.) for a preset time t2 (about 10 minutes) while the surface of the light absorbing layer is kept as dipped in the solution.

In the third step, the dipping of the light absorbing layer in the solution being kept at the preset temperature T2 is continued further for a preset time t3 (about 40 minutes) after the solution reached the temperature T2 at the end of the second step. The buffer layer 6 formed on the light absorbing layer is washed with an overflow of pure water.

The above-described process provides an In-layer of fine particles deposited by the first step, an In-layer of larger (than those deposited by the first step) particles deposited by the second step and an In-layer of further larger (than those deposited by the second step) particles deposited by the third step.

This is explained as follows:

The aqueous solution is an almost transparent solution which slightly assumes a yellow color of thioacetamide at a room temperature.

The process of forming the buffer layer 6 on the light absorbing layer by depositing particles of In with growth of colloids in the aqueous solution is as follows:

The solution is emulsified as its temperature rises. With progress of chemical reaction, the emulsion gradually changes its color from deep white to yellow. Since InS is an orange solid in itself, the emulsion represents that InS-crystals are growing in the solution. The change of color of the solution from white to yellow can be considered to indicate that InS particles in the solution are further growing to have larger sizes.

In other words, the white colloid has particles which are smaller in size than the wavelength of yellow light. Yellow colloid has In-particles which are grown large enough to assume its orange color by reflecting orange color light.

The speed of changing color of the solution from white to yellow relates to a ratio of concentration of indium chloride to concentration of thioacetamide in the aqueous solution. The color changing speed is apt to increase as the relative concentration of thioacetamide in the solution is lower.

It has been found that the buffer layer can grow on the light absorbing layer 5 dipped in the aqueous solution during the time of heating the solution from the room temperature to the specified temperature but the buffer layer does not grow in the emulsion having reached the specified temperature.

Figure 5:
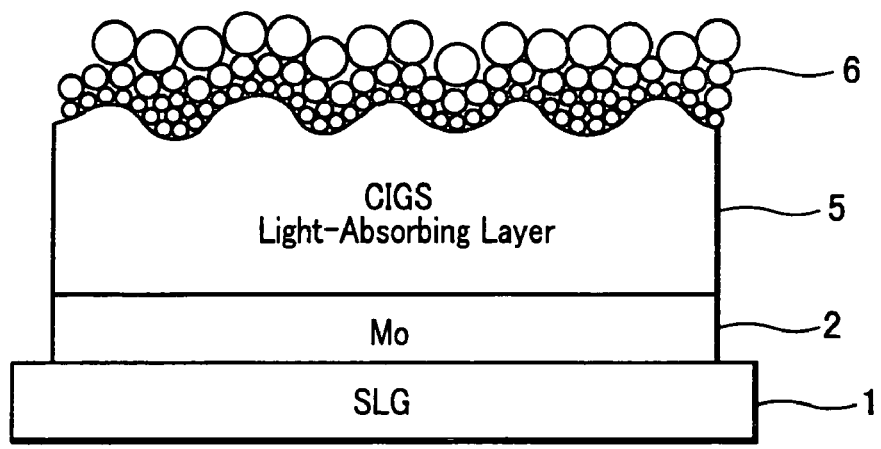
FIG. 5 is a sectional illustration of forming by CBD a buffer layer of InS particles on a light absorbing layer.

Accordingly, the process of steps 1 to 3 cause particles of InS to deposit from the solution onto the surface of the light absorbing layer by stepwise increasing sizes of deposits. This can create a buffer layer 6 having a structure featured by continuous distribution of Ins particles with stepwise increased sizes. As the result of this, as shown in FIG. 5, the buffer layer 6 tightly adheres to a rough surface of the light absorbing layer 5 with an improved coverage.

The reason why the layer cannot grow in the emulsion is considered to be that large particles can have a small contact surface with the light absorbing layer 5. It is also considered that the deposit of small particles serves as adhesive to grow the buffer layer 6.

The use of a layer of In-particles as the buffer layer 6 offers the following advantage:

a) Expanding a bandgap by the effect of particle sizes;
b) Expanding a bandgap by the effect of particle surfaces;
c) Improvement of durability against a plasma damage; and
d) Reduction of shunt path by the high resistance of the layer.

It has been considered that the use of the InS-layer in a solar cell is disadvantageous since InS has a small bandgap and hard to pass light of short wavelengths.

The above-mentioned disadvantage can be overcome by making the layer composed of fine particles of InS. According to the present invention, the quality of the buffer layer is changed by regulating pH of the aqueous solution in steps 1 to 3. In practice, the aqueous solution is used at PH of 1 to 3.5 and 3.5 to 12.0 in steps 1 and 2, respectively, while the aqueous solution is used at pH of 3.5 to 12.0 in step 3. Thus, the lower side deposition of the buffer layer 6 is rich in InS by regulating the pH of the aqueous solution to a acidic value of a pH scale while the upper side deposition is rich in InOH.InO by regulating the pH of the solution to a alkaline value.

When pH of the solution of indium chloride and thioacetamide is regulated to about 1-3.5, then the following chemical reaction takes place:

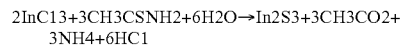
2InCl3+3CH3CSNH2+6H2O→In2S3+3CH3CO2+ 3NH4+6HCl

When pH of the aqueous solution containing trivalent ions is regulated to 3.4-12, then the following chemical reaction takes place:

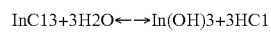
InCl3+3H2O←→In(OH)3+3HCl

By regulating the pH value of the aqueous solution using the above-described chemical reactions, the quality of the buffer layer 6 can be changed.

Consequently, it becomes possible to achieve the following optimum interfacial condition between the light absorbing layer 5 and the buffer layer 6 as well as the buffer layer 6 and the transparent electrode 7.

An In2S3-rich layer obtained by regulating the pH of the solution to a value of the acidic side can effectively cover the top surface of the light absorbing layer 5 achieving the junction best suited to the layer 5.

To prevent a plasma damage from reaching the junction surface with the buffer layer 6 in the process of forming the transparent electrode 7, it is necessary to increase the thickness of the buffer layer 6. However, it is disadvantageous to increase the thickness of the InS-rich layer because InS has a small bandgap and may deteriorate the optical transmittance of the layer. On the contrary, the layer rich in In(OH)3.In2O3, which is obtained by regulating the pH of the solution to the alkaline-side value, has a lager bandgap and can be used as a transparent conducting layer. Therefore, it is desirable to form a thicker layer rich in In(OH)3.In2O3, which can be free from the affection of plasma damage in the process of forming a transparent electrode 7 and can attain the suitable conformity to the transparent electrode 7 and can attain the suitable conformity to the transparent electrode 7 without decreasing the optical transmittance of the buffer layer.

INDUSTRIAL APPLICABILITY

As is apparent from the foregoing, according to the present invention, it is possible to provide a method of fabricating a thin-film compound solar cell having an n-type buffer layer formed therein for providing a hetero-junction with a p-type compound semiconductor light absorbing layer formed on a back electrode, wherein the buffer layer is formed by applying a chemical bath deposition (CBD) process using an aqueous solution for dipping the light absorbing layer to deposit particles on the surface thereof. In this process, the temperature of the solution is controlled from low to high to increase sizes of the particles to be deposited on the light absorbing layer so as to form the buffer layer which possesses a high optical transmittance, tight adherence to the light absorbing layer and conformity with the transparent electrode formed thereon though it is made of InS material generally possessing a small bandgap and hard to pass light of short wavelengths.

According to the present invention, it is also possible to provide a method of fabricating a thin-film compound solar cell having an n-type buffer layer formed therein for providing a hetero-junction with a p-type compound semiconductor light absorbing layer formed on a back electrode, wherein the buffer layer is formed by applying a chemical bath deposition (CBD) process using an aqueous solution for dipping the light absorbing layer to deposit particles on the surface thereof. The process provides a buffer layer of n-type semiconductor material, which is featured by gradually or step-by-step increased sizes of deposited particles in the outward direction from the light absorbing layer or featured by a structure having upper side deposits of lamer pH-values and lower side deposits of smaller pH values. The buffer layer thus formed possesses a high optical transmittance, tight adherence to the light absorbing layer and conformity with the transparent electrode formed thereon though it is made of InS material generally possessing a small band gap and hard to pass light of short wavelengths.

The invention claimed is:

1. A method of fabricating a thin-film compound solar cell having an n-type buffer layer formed therein for providing a heterojunction with a p-type semiconductor light absorbing layer formed on a back electrode,
   wherein a layer of In—Cu—Ga is formed by a sputtering process and then heated in a selenium (Se) atmosphere to form a CIGS (Copper-Indium-Gallium-Selenium) light absorbing layer,
   wherein the buffer layer is formed on the light absorbing layer by chemical bath deposition (CBD) process using an aqueous solution for dipping therein a surface of the light absorbing layer,
   wherein the CBD process comprises forming a first step layer on the light absorbing layer in a solution being kept at a first specified temperature in the first step, depositing a second step layer on the first step layer in the solution by increasing temperature of the solution from the first specified temperature to a second specified temperature so as to deposit particles gradually being larger in grain size in the direction departing from the light absorbing layer surface, forming a third step layer being larger in grain size than the second step layer, the third step layer being formed by deposition on the second step layer in the solution being kept at the second specified temperature, wherein the first step and second step layers are formed on the light absorbing layer by deposition being rich in InS by regulating the pH value of the solution in a range of 1 to 3.5, and then the third step layer is formed on the layer formed by the first and second steps by deposition being rich in InOH—InO by regulating the pH value of the solution in a range of 3.5 to 12, wherein the formation of the buffer layer on the light absorbing layer is accomplished by stopping temperature control and pH regulation of the solution in a fourth step comprising performing the process of the first, second and third steps only once, providing a buffer layer that is formed by depositing particles gradually being larger in grain size in the direction departing from the light absorbing layer surface and wherein, after the formation of the buffer layer, a transparent electrode is formed by a sputtering process.

* * * * *

UNITED STATES PATENT AND TRADEMARK OFFICE
CERTIFICATE OF CORRECTION

| | | |
|---|---|---|
| PATENT NO. | : 7,939,745 B2 | Page 1 of 1 |
| APPLICATION NO. | : 10/509303 | |
| DATED | : May 10, 2011 | |
| INVENTOR(S) | : Satoshi Aoki | |

It is certified that error appears in the above-identified patent and that said Letters Patent is hereby corrected as shown below:

In the Specification:

Column 3, Line 23, delete the portion of text reading "(InCl13.4H2O)" and replace with --(InCl13 • 4H2O)--.

Column 4, Line 43, delete the portion of text reading "InOH.InO" and replace with --InOH • InO--.

Column 5, Line 5, delete the portion of text reading "In(OH)3.In2O3" and replace with --In(OH)3 • In2O3--.

Column 5, Line 9, delete the portion of text reading "In(OH)3.In2O3" and replace with --In(OH)3 • In2O3--.

Column 5, Line 47, delete the portion of text reading "lamer" and replace with --larger--.

Signed and Sealed this
Twenty-first Day of June, 2011

David J. Kappos
*Director of the United States Patent and Trademark Office*